United States Patent [19]

Behn et al.

[11] 4,294,194

[45] Oct. 13, 1981

[54] DEVICE FOR COATING OBJECTS

[75] Inventors: Reinhard Behn; Hermann Heywang, both of Munich; Horst Pachonik, Unterhaching, all of Fed. Rep. of Germany

[73] Assignee: Siemens Aktiengesellschaft, Berlin & Munich, Fed. Rep. of Germany

[21] Appl. No.: 89,857

[22] Filed: Oct. 31, 1979

[30] Foreign Application Priority Data

Nov. 8, 1978 [DE] Fed. Rep. of Germany ....... 2848480

[51] Int. Cl.³ .............................................. C23C 13/00
[52] U.S. Cl. .................................... 118/719; 118/730; 118/733; 34/242
[58] Field of Search ....................... 118/719, 730, 733; 34/242

[56] References Cited

U.S. PATENT DOCUMENTS

| | | | |
|---|---|---|---|
| 2,740,928 | 4/1956 | Ward | 118/730 |
| 3,023,727 | 3/1962 | Theodosean et al. | 118/730 |
| 3,043,728 | 7/1962 | Stauffer | 118/733 |
| 3,110,620 | 11/1963 | Bertelsen | 118/730 |
| 3,183,563 | 5/1965 | Smith | 118/733 |
| 3,502,051 | 3/1970 | Adams | 118/720 |

FOREIGN PATENT DOCUMENTS 1009883  6/1957  Fed. Rep. of Germany .

Primary Examiner—Ronald H. Smith
Assistant Examiner—Richard Bueker
Attorney, Agent, or Firm—Hill, Van Santen, Steadman, Chiara & Simpson

[57] ABSTRACT

A device is disclosed for the formation of electric capacitor metal coatings and glow polymerization coatings to be applied in a vacuum installation in separate vacuum chambers. The air locks which are required between these vacuum chambers are designed to be particularly space saving by providing a transport device which consists of a drum which can only be driven in one direction and wherein the air lock which precedes the vacuum chamber subject to the lower residual gas pressure considered in the flow direction has longer diffusion paths between the vacuum chambers.

8 Claims, 1 Drawing Figure

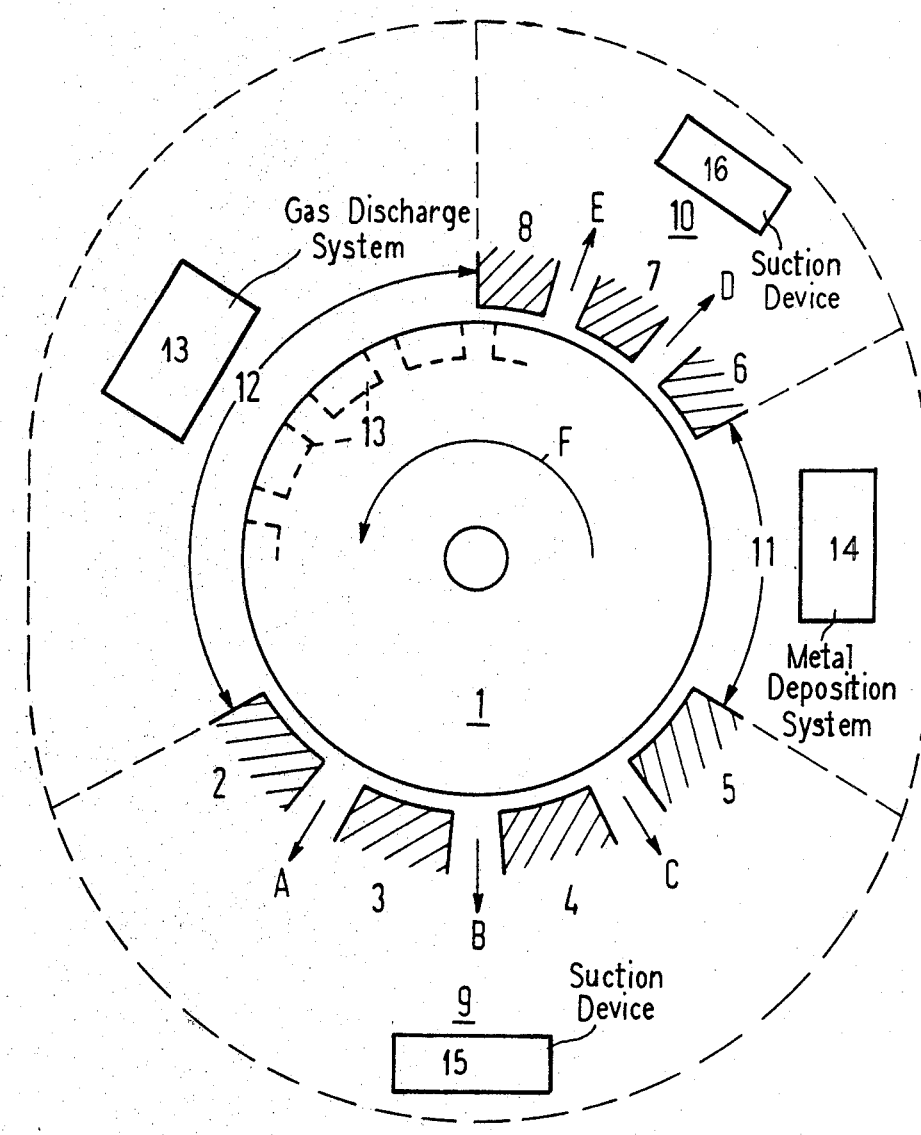

DEVICE FOR COATING OBJECTS

BACKGROUND OF THE INVENTION

The present invention relates to a device for coating objects, in particular for the alternating production of metal coatings and gas discharge (glow) polymerization coatings for electrical capacitors. At least two vacuum chambers are provided which are separated from one another by air locks, and also a transport device is provided which is able to transport the objects to be coated such as capacitor carriers or films through a separate air lock from a first vacuum chamber into a second vacuum chamber and back again. In the vacuum chambers, devices for coating the carriers are provided. The air locks contain jaws or blocking sections which are arranged directly opposite the transport device and leave only a narrow gap with respect to the latter. A suction tube serving to withdraw the residual gas is arranged between two jaws of an air lock.

A device of this kind is disclosed in German AS 10 09 883, incorporated herein by reference. Only one metal layer is applied there, however, and feed rollers are arranged in the second vacuum chamber. The two air locks of this reference each have three jaws of equal length. Here "length" of the jaws or blocking sections is to be understood as their dimensions along the transport device. Thus it determines the length of the diffusion path for the gas from one chamber into the other. The air locks of the above reference cover a large part of the transport device which in the reference consists of a drum.

SUMMARY OF THE INVENTION

An object of the present invention is to reduce the expense in terms of apparatus for the air locks and at the same time to facilitate a high transit speed for the objects to be coated.

This object is realized in accordance with the invention in that the transport device is only able to move in one direction through the air locks and that the air lock located in front of the vacuum chamber subject to the smaller residual gas pressure has longer diffusion paths than the air lock located behind the vacuum chamber subject to the lower residual gas pressure.

The invention is based on the recognition that a speed of the transport device which is expedient for coating objects, in particular for the production of metal coatings and glow (or gas discharge) polymerization coatings for electric capacitors, considerably influences the gas flow through the air locks. In one direction the gas flow is accelerated towards the chambers subject to the lower gas pressure and in the other direction it is decelerated. Therefore it is possible to considerably reduce the expense as a result of an asymmetrical design of the air locks. This asymmetrical design of the air locks is advantageously achieved in that the air lock located in front of the vacuum chamber subject to the lower residual gas pressure considered in the flow direction of the transport device is provided with longer jaws. In addition this air lock can contain more jaws interspaced by suction tubes. This arrangement is advantageous if the objects which are to be coated and the supports on the transport devices encompass free areas which, in addition to the diffusion through the remaining gaps, facilitate a considerable gas transport.

A particularly simple embodiment of the device corresponding to the invention consists in that it contains a drum for the transport device. This drum can be set in rotation only in one direction, and the cylindrical casing of this drum passes through at least two air locks and two vacuum chambers subject to different residual gas pressure. The objects arranged on the carriers are then coated in these vacuum chambers. The invention is particularly advantageous in this design of the device since the width of the gap cannot be reduced in arbitrary fashion and consequently the length of the diffusion paths is fundamentally governed by the physical properties of the diffusion processes. In particular when glow (gas discharge) polymerization coatings are to be applied, large drum dimensions are required in order to accommodate the required gas discharge polymerization path and the air lock length there. Consequently the proposed simplification results in a considerable reduction in expense.

A further advantage of the invention consists in a considerable reduction in the coating time due to the shortening of the path which must be passed through in the region of the air lock.

If a drum is used which has recesses which hold the carriers which are to be coated, optimum evacuation can be achieved in that prior to the actual coating the drum is already in rotation and coating does not take place until the optimum vacuum has been achieved. Consequently the deceleration of the diffusion by the drum in the air lock with the shorter diffusion path is achieved actually before the coating process.

BRIEF DESCRIPTION OF THE DRAWING

The figure schematically illustrates in a fragmentary view a device corresponding to the invention.

DESCRIPTION OF THE PREFERRED EMBODIMENTS

A drum 1 is only able to be driven in the direction of rotation F. The vacuum chamber 11 shown schematically by dotted lines which is subject to the lower residual gas pressure is preceded by a suction device 15 at an air lock 9 having a long diffusion path between the two vacuum chambers 12 and 11. The air lock 9 shown schematically by dotted lines is provided with a larger number of jaws or blocking sections 2 to 5 than the air lock 10 having a suction device 16 and which is arranged following the vacuum chamber 11 subject to the lower residual gas pressure. In addition the jaws 2 to 5 of the air lock 9 are longer than the jaws 6 to 8 of the air lock 10. The residual gas which is drawn in particular into the recesses 13 which serves to support the carriers from the vacuum chamber 12 subject to the higher residual gas pressure is sucked away between the jaws 2 to 5 of the air lock 9 in the directions A to C. In the air lock 10 only the residual gas which diffuses against the direction of rotation F of the drum 1 requires to be sucked away in the directions D and E between the jaws 6 to 8. The shorter design of the jaws 6 to 8 of the air lock 10 leaves a substantial part of the drum 1 exposed so that a glow or gas discharge polymerization system 17 well known in this art can be arranged for example in the chamber 12. A metal vapor deposition system 14 well known in this art is preferably arranged in the chamber 11.

Although various minor modifications may be suggested by those versed in the art, it should be understood that we wish to embody within the scope of the patent warranted herein, all such embodiments as reasonably and properly come within the scope of our contribution to the art.

We claim as our invention:

1. A device for coating carriers with alternating different coatings in a different vacuum, comprising: at least first and second vacuum chambers separated from one another by first and second vacuum air locks; transport means for transporting the carriers to be coated in only one moving direction from the first air lock through the first vacuum chamber to the second air lock and back towards the first air lock through the second vacuum chamber; means for coating the carriers arranged on the transport means in each of the vacuum chambers; each of the air locks having jaws arranged directly adjacent the transport means and which form a relatively narrow gap therewith; suction means for drawing off residual gas between jaws of each of the air locks; and the first air lock, located in front of the first vacuum chamber in the direction of movement, having a lower residual gas pressure and having longer diffusion paths than the second air lock following the first vacuum chamber in the direction of movement.

2. A device of claim 1 wherein the first air lock in front of the first vacuum chamber subject to the lower residual gas pressure has longer length jaws than the second air lock behind the first chamber as measured in a direction around the drum.

3. A device of claim 1 wherein the first air lock located in front of the first vacuum chamber subject to the lower residual gas pressure has more jaws interspaced by suction tubes than the second air lock.

4. A device of claim 1 wherein the transport means comprises a drum which rotates only in one direction, a cylindrical peripheral casing of the drum positioned to pass directly adjacent the first and second air locks, and the first and second vacuum chambers being subject to different residual gas pressure.

5. A device according to claim 1 wherein the first vacuum chamber has means for producing metal vapor deposition coatings thereat and the second vacuum chamber has means for producing gas discharge polymerization coatings thereat.

6. A device for coating carriers of electrical capacitors, comprising: at least first and second vacuum chambers separated from one another by first and second vacuum air locks; transport means comprising a drum around which the vacuum chambers and air locks are alternately positioned for transporting the carriers in only one direction from the first air lock through the first vacuum chamber to the second air lock and then through the second vacuum chamber back to the first air lock; means for coating the carriers arranged on the transport means in each of the vacuum chambers; the first and second air locks each having a plurality of blocking sections with air channels formed therebetween and means for providing a vacuum at the air locks and through gaps between adjacent blocking sections and so as to draw off residual gas at each of the air locks; and the first air lock located in front of the first vacuum chamber in the direction of movement being designed to extend over a greater perimeter segment of the drum than the second air lock and also having larger gaps between blocking sections than the second air lock following the first vacuum chamber in the direction of movement.

7. The device of claim 6 wherein the first air lock has more gaps formed between blocking sections than the second air lock.

8. The device of claim 6 wherein the first air lock has gaps with a greater width than gaps of the second air lock formed between blocking sections.

* * * * *